United States Patent
Crowley et al.

(10) Patent No.: US 6,639,308 B1
(45) Date of Patent: Oct. 28, 2003

(54) NEAR CHIP SIZE SEMICONDUCTOR PACKAGE

(75) Inventors: Sean Timothy Crowley, Phoenix, AZ (US); Angel Orabuena Alvarez, Gilbert, AZ (US); Jun Young Yang, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/687,876

(22) Filed: Oct. 13, 2000

(30) Foreign Application Priority Data

Dec. 16, 1999 (KR) .............................. 99-58163
Dec. 16, 1999 (KR) .............................. 99-58165

(51) Int. Cl.[7] ................... H01L 23/495; H01L 23/48; H01L 23/52; H01L 21/44; H01L 21/48
(52) U.S. Cl. ................... 257/676; 257/692; 438/123
(58) Field of Search ................... 257/676, 692; 438/123

(56) References Cited

U.S. PATENT DOCUMENTS

| | | | |
|---|---|---|---|
| 4,258,381 A | | 3/1981 | Inaba |
| 5,065,223 A | * | 11/1991 | Matsuki et al. ............... 357/68 |
| 5,493,151 A | | 2/1996 | Asada et al. |
| 5,703,407 A | | 12/1997 | Hori |
| 5,753,977 A | | 5/1998 | Kusaka et al. |
| 5,834,830 A | | 11/1998 | Cho |
| 6,060,768 A | | 5/2000 | Hayashida et al. |
| 6,143,981 A | | 11/2000 | Glenn ....................... 174/52.4 |
| 6,229,200 B1 | * | 5/2001 | Mclellan et al. ............. 257/666 |
| 6,242,281 B1 | | 6/2001 | Mclellan et al. ............. 438/106 |
| 6,294,100 B1 | | 9/2001 | Fan et al. ....................... 216/14 |
| 6,355,502 B1 | | 3/2002 | Kang et al. ................. 438/110 |
| 6,388,336 B1 | * | 5/2002 | Venkateshwaran et al. . 257/779 |

FOREIGN PATENT DOCUMENTS

| | | | |
|---|---|---|---|
| EP | 0 844 665 | 5/1998 | |
| EP | 1 032 037 | 8/2000 | |
| JP | 05-129473 | 5/1993 | |
| JP | 08222682 | * 8/1996 | .......... H01L/23/50 |
| JP | 09008205 | * 1/1997 | .......... H01L/23/50 |
| JP | 09092775 | 4/1997 | |
| WO | WO 99/67821 | 12/1999 | |

* cited by examiner

Primary Examiner—Carl Whitehead, Jr.
Assistant Examiner—Nema Berezny
(74) Attorney, Agent, or Firm—Stetina Brunda Garred & Brucker

(57) ABSTRACT

A semiconductor package that can fit semiconductor chips of various sizes without having to change the footprint of the carrier package. One aspect of the semiconductor package comprises a leadframe, a semiconductor chip attached to the leadframe, electrical connectors electrically connecting the semiconductor to the leadframe, and a sealing material. The leadframe has a plurality of leads, with each one of the plurality of leads having an upper side, a lower exposed side, and a laterally exposed side. The upper side of each one of the plurality of leads define a generally co-planar surface. Further, after sealing material encapsulates the components of the semiconductor package in a spacial relationship, the lower exposed side and the lateral exposed side of the plurality of leads are exposed to the outside surface of the semiconductor package.

7 Claims, 5 Drawing Sheets

NEAR CHIP SIZE SEMICONDUCTOR PACKAGE

BACKGROUND OF THE INVENTION

1. Field of the Invention

The present invention relates to packaged semiconductors, semiconductor packages, leadframe assemblies therefor, and more particularly, but not by way of limitation, to semiconductor packages that can accept semiconductor chips of various sizes without having to change the footprint of the semiconductor package.

2. History of Related Art

It is conventional in the electronic industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal leadframes for supporting an integrated circuit chip which is bonded to a chip paddle region formed centrally therein. Bond wires which electrically connect pads on the integrated circuit chip to individual leads of the leadframe are then incorporated. An encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a leadframe as the central supporting structure of such a package. A portion of the leadframe completely surrounded by the plastic encapsulant is internal to the package. Portions of the leadframe extend internally from the package and are then used to connect the package externally. More information relative to leadframe technology may be found in Chapter 8 of the book *Micro Electronics Packaging Handbook*, (1989), edited by R. Tummala and E. Rymaszewski, incorporated by reference herein. This book is published by Van Nostrand Reinhold, 115 Fifth Avenue, New York, N.Y.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a printed circuit board on which a significant number of such semiconductor packages are secured to provide multiple electronic functions. These electronic appliances are typically manufactured in reduced sizes and at reduced costs, which results in increased consumer demand. Accordingly, not only are semiconductor chips highly integrated, but also semiconductor packages are highly miniaturized with an increased level of package mounting density.

According to such miniaturization tendencies, semiconductor packages, which transmit electrical signals from semiconductor chips to printed circuit boards and support the semiconductor chips on the printed circuit boards, have been designed to have a small size. By way of example only, such semiconductor packages may have a size on the order of 1×1 mm to 10×10 mm. Examples of such semiconductor packages are referred to as MLF (micro leadframe) type semiconductor packages and MLP (micro leadframe package) type semiconductor packages. Both MLF type semiconductor packages and MLP type semiconductor packages are generally manufactured in the same manner.

One specific problem with the prior art is that chip sizes differ and/or increases due to different computing requirements of different products. With existing packaging design, fitting these larger chips means the packages must be made bigger. Bigger packages have larger footprints (the locations where the leads physically and electrically connect to printed circuit boards). The larger footprint forces the printed circuit boards to be redesigned for proper electrical connection. This redesign takes time and money. Thus, a semiconductor package that can fit circuit chips of different sizes without changing the semiconductor package's footprint is needed.

SUMMARY OF THE INVENTION

The present invention relates to semiconductor packages that can accept semiconductor chips of various sizes without having to change the footprint of the carrier package. More particularly, one aspect of the present invention comprises a leadframe, a semiconductor chip attached to the leadframe, bond pads electrically connecting the semiconductor to the leadframe, and a sealing material. The leadframe has a plurality of leads, with each one of the plurality of leads having an upper side, a lower exposed side, and a laterally exposed side. The upper side of each one of the plurality of leads define a generally co-planar surface for supporting the semiconductor chip. Because the semiconductor chip rests on the co-planar and unobstructed surface defined by the upper side of the leads, semiconductors of different sizes can be attached to the semiconductor package without having to change the footprint of the semiconductor package. Finally, after sealing material encapsulates the components of the semiconductor package in a spacial relationship, the lower exposed side and the lateral exposed side of the plurality of leads are exposed to the outside surface of the semiconductor package.

Another aspect of the present invention is a leadframe that comprises a plurality of leads and a tie bar connecting to the plurality of leads. Each one of the plurality of leads has an upper side and a lower exposed side, with the upper side of each one of the plurality of leads forming a generally co-planar surface with the upper side of at least some of the leads. Further, when the tie bars are trimmed off the leadframe, they leave a lateral surface of the plurality of leads exposed to the lateral side of the semiconductor package.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE PREFERRED EMBODIMENT

Figure 1:
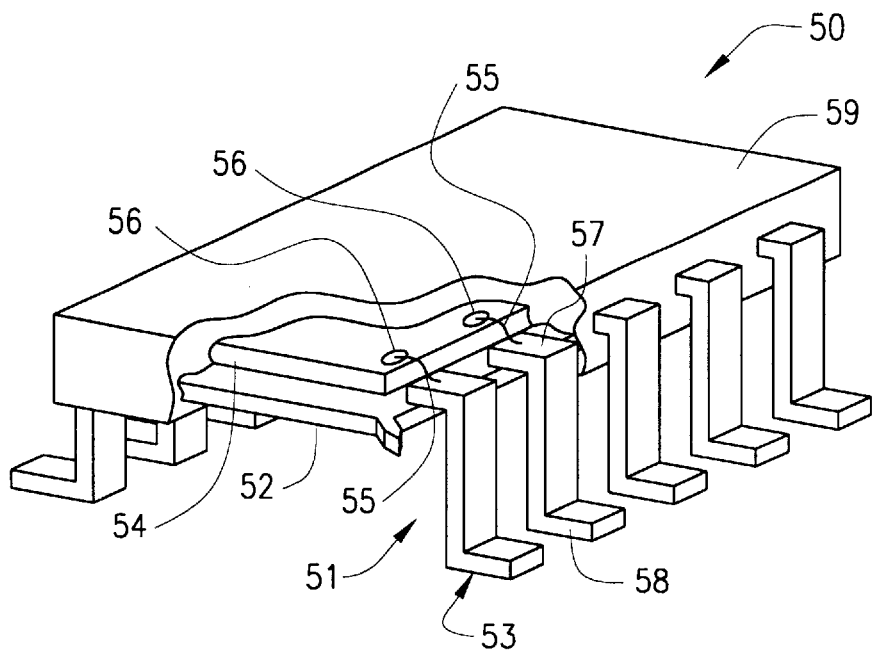
FIG. 1 is a perspective cut-away view of a prior art semiconductor carrier package.

Referring first to FIG. 1, there is shown a perspective cut-away view of a first prior art semiconductor package 50. Semiconductor package 50 is described below to provide a better context for understanding the semiconductor package constructed in accordance with the principles of the present invention. Semiconductor package 50 includes a leadframe 51 (partially shown in FIG. 1) having a paddle 52 and a plurality of leads 53. Leads 53 are located on opposing sides of semiconductor package 50, are generally "Z" shaped, and are spaced parallel and apart from each other. Paddle 52 rests below a horizontal plane defined by the top surface of the top side 57 of leads 53. A semiconductor chip 54 is attached to paddle 52 by using an adhesive. At least a part of semiconductor chip 54 rests below a plane defined by the top side 57 of leads 53. A plurality of bond pads 56 are located on semiconductor chip 54. A plurality of wires 55 electrically connect semiconductor chip 54 (through bond pads 54) to leads 53. Bottom side 58 of leads 53 physically and electrically connect the semiconductor package 50 to a printed circuit board (not shown). The above components are affixed in a spacial relationship and are protected from the outside environment by sealing material 59.

If another semiconductor chip that is larger than semiconductor chip 54 is placed in semiconductor package 50, that larger semiconductor chip will touch and be obstructed by leads 53 because a part of the larger semiconductor chip rests below the plane defined by the top side 57 of leads 53. In order to fit this larger semiconductor chip into semiconductor package 50, leads 53 of semiconductor package 50 must be moved farther apart from the lateral centerline of semiconductor package 50, thus changing the footprint of semiconductor package 50. A change in semiconductor package 50's footprint forces a redesign of the printed circuit board to be physically and electrically attached to semiconductor package 50. The redesign is necessary because the physical directions of the electrical contact points of the printed circuit board no longer fits the new larger semiconductor package 50. Redesigning the printed circuit board is undesirable because it incurs additional monetary costs and time delays.

Figure 2:
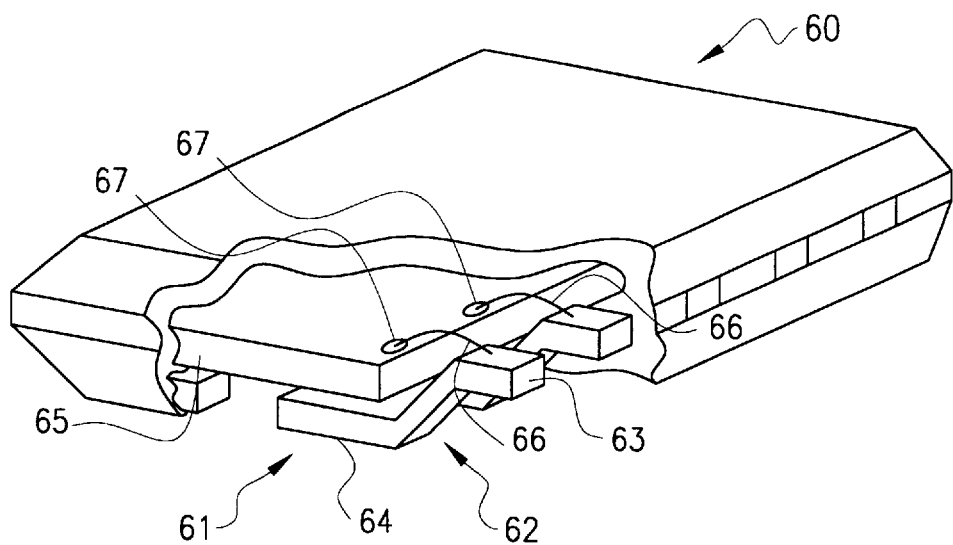
FIG. 2 is a perspective cut-away view of another prior art semiconductor carrier package.

Referring now to FIG. 2, there is shown a perspective cut-away view of a second prior art semiconductor package 60. Again, semiconductor package 60 is described below to provide a better context for understanding the semiconductor package constructed in accordance with the principles of the present invention. Semiconductor package 60 has a leadframe 61 (shown partially) having a plurality of leads 62 lined up lengthwise along the two longer sides of semiconductor package 60. Leads 62 are spaced parallel and apart from each other. Each lead in the plurality of leads 62 has an upper part 63 and a lower part 64. A semiconductor chip 65 is placed on top of lower part 64 of leads 62. A plurality of bond pads 67 are located on semiconductor chip 65 for connection to a plurality of wires 66. Wires 66 electrically connect semiconductor chip 65 to leads 62.

If another semiconductor chip that is larger than semiconductor chip 65 is placed in semiconductor package 60, that larger semiconductor chip will touch and be obstructed by leads 62. Thus, in order to fit a larger semiconductor chip into semiconductor package 60, leads 62 must be moved outward. Moving leads 62 outward changes the footprint of semiconductor package 60, thereby forcing a redesign of the printed circuit board. Again, redesigning the printed circuit board is underdesirable because the redesigning process incurs additional monetary costs and time delays.

Figure 3:
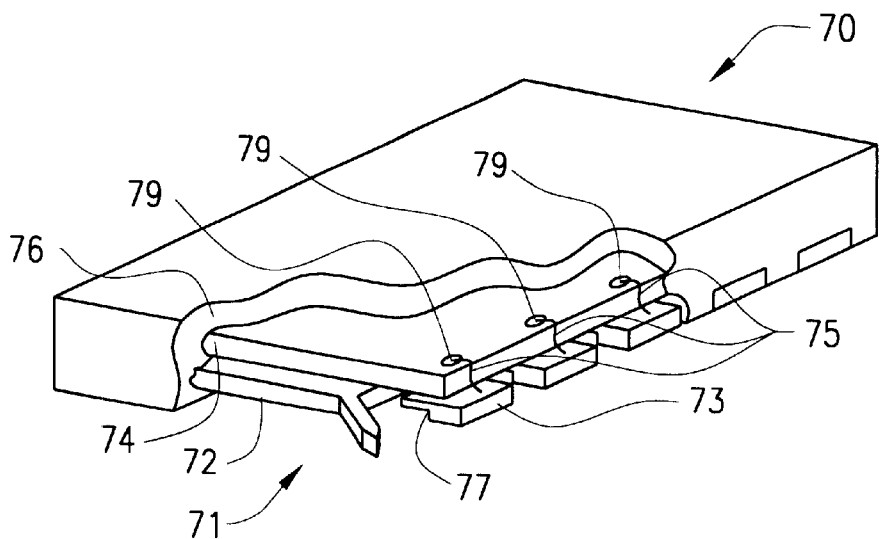
FIG. 3 is a perspective cut-away view of a first embodiment of a semiconductor package constructed in accordance with the principles of the present invention.

Referring now to FIG. 3, there is shown a perspective cut-away view of semiconductor package 70 that is a first embodiment of a semiconductor package constructed in accordance with the principles of the present invention. Semiconductor package 70 generally consists of a leadframe 71 (FIG. 4), a semiconductor chip 74, a plurality of wires 75, and sealing material 76. A more detailed description of semiconductor package 70 appears below.

Figure 4:
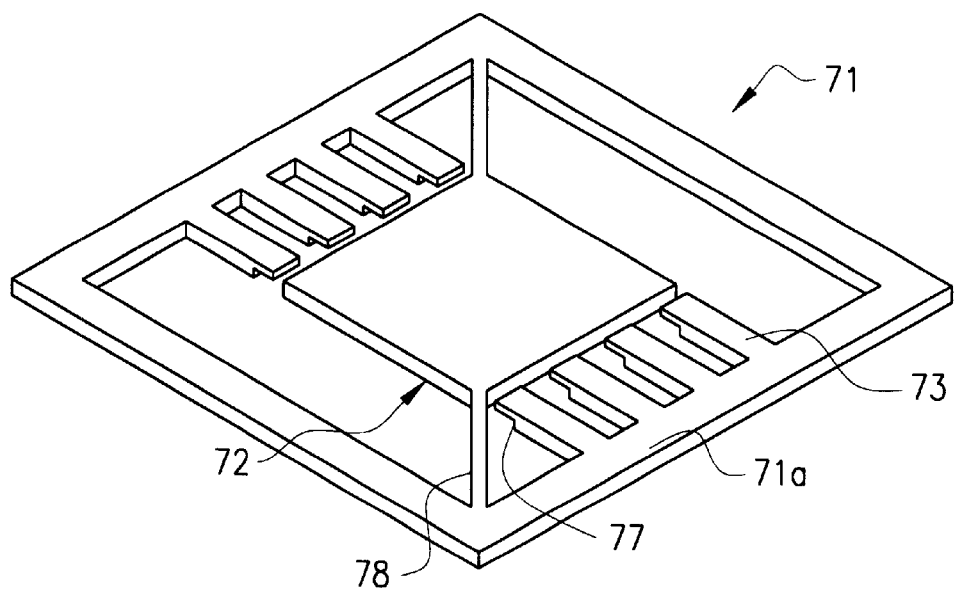
FIG. 4 is a perspective view of a leadframe of a first embodiment of a semiconductor package constructed in accordance with the principles of the present invention.

Referring now to FIG. 4, there is shown a detailed perspective view of a leadframe 71 of the first embodiment of a semiconductor package constructed in accordance with the principles of the present invention. Leadframe 71 is made of an electrically conductive material such as, for example, copper. Leadframe 71 has a paddle 72 surrounded by a plurality of leads 73. Leads 73 and paddle 72 are connected to each other via a tie bar 71 a located on the outer perimeter of leadframe 71. Leads 73 do not touch paddle 72 and are placed parallel and apart from each other. Each one of the leads 73 has a notch 77 at the end near paddle 72. Notch 77 increases the locking strength between leads 73 and sealing material 76 so that leads 73 are less likely to become detached from semiconductor package 70. The bottom of each one of leads 73, after packaging, is exposed to the outside of semiconductor package 70 for electrically and physically connecting semiconductor package 70 to a printed circuit board. To minimize corrosion, the bottom of leads 73 are coated or electroplated with tin, gold, tin lead, nickel palladium, tin bismuth, or other comparable corrosion-minimizing material. Paddle 72 is attached to leadframe 71 through a plurality of connectors 78. Paddle 72 may or may not have a notch (not shown) similar to notch 77 for increasing strength between paddle 72 and sealing material 76. The top side of leads 73 and paddle 72 rest in the same horizontal plane to allow semiconductor chip 74 to be placed on top of both paddle 72 and a portion of leads 73. The bottom of paddle 72 may or may not be exposed to the outer bottom surface of semiconductor 70.

Referring back to FIG. 3, there is shown a perspective cut-away view of semiconductor package 70. Having described leadframe 71 in detail above, additional components of semiconductor package 70 will now be discussed. Semiconductor chip 74 is attached to the top of both paddle 72 and leads 73. Semiconductor chip 74 is attached to paddle 72 and leads 73 through an adhesive by using any technique known in the art. Because the top surface of paddle 72 and leads 73 rest in the same horizontal plane, the size of semiconductor chip 74 can vary so that semiconductor chip 74 may rest only on paddle 72 or extend over and rest on top of leads 73. This configuration of paddle 72 in relation to leads 73 allows semiconductor chips of different sizes to fit in semiconductor package 70 without changing the footprint of semiconductor package 70.

Referring still to FIG. 3, semiconductor package 70 will now continue to be described. A plurality of bond pads 79 are located on semiconductor chip 74 for electrical connection. A plurality of wires 75 electrically connect each bond pad of bond pads 79 to each lead of leads 73. Wires 75 can be made of any electrically conductive material such as, for example, gold, silver, aluminum, or an alloy thereof Both the lateral side and the bottom side of each one the of leads 73 exposed to the outside of semiconductor package 70 may or may not be coated or electroplated with corrosion-minimizing material such as, for example, tin, gold, tin lead, nickel palladium, tin bismuth, or similar materials. All the components described above are encased (with the exception of the bottom and one lateral side of each lead of leads 73) in sealing material 76. Sealing material 76 may be theremoplastics or thermoset resins, with thermoset resins including silicones, phenolics, and epoxies. Semiconductor package 70 is electrically and physically attached to a printed circuit board (not shown) through any method known in the art of semiconductor package attachment such as, for example, soldering leads 73 to the printed circuit board.

Figure 5:
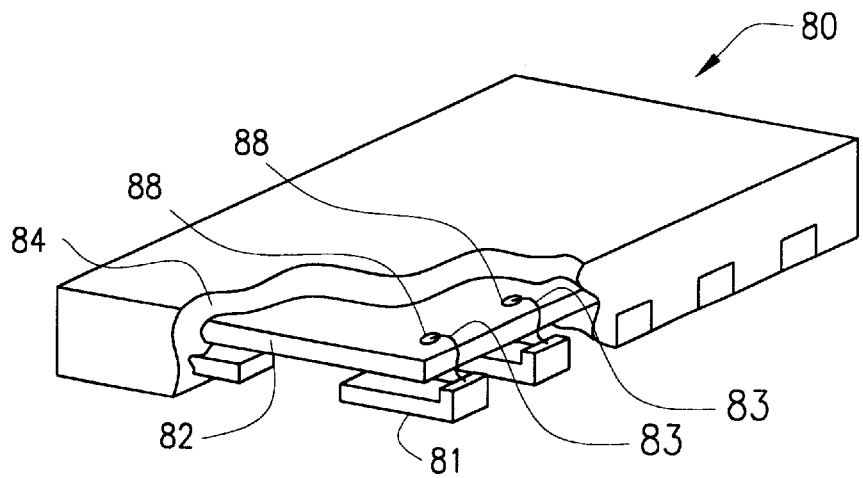
FIG. 5 is a perspective cut-away view of a second embodiment of a semiconductor package constructed in accordance with the principles of the present invention.

Referring now to FIG. 5, there is shown semiconductor package 80, which is a second embodiment of a semiconductor package constructed in accordance with the principles of the present invention. Semiconductor package 80 has a plurality of leads 81, a semiconductor chip 82, a plurality of wires 83, and sealing material 84. Semiconductor package 80 differs from semiconductor package 70 in that semiconductor package 80 lacks a paddle. Semiconductor package 80 will be discussed in more detail below.

Figure 6:
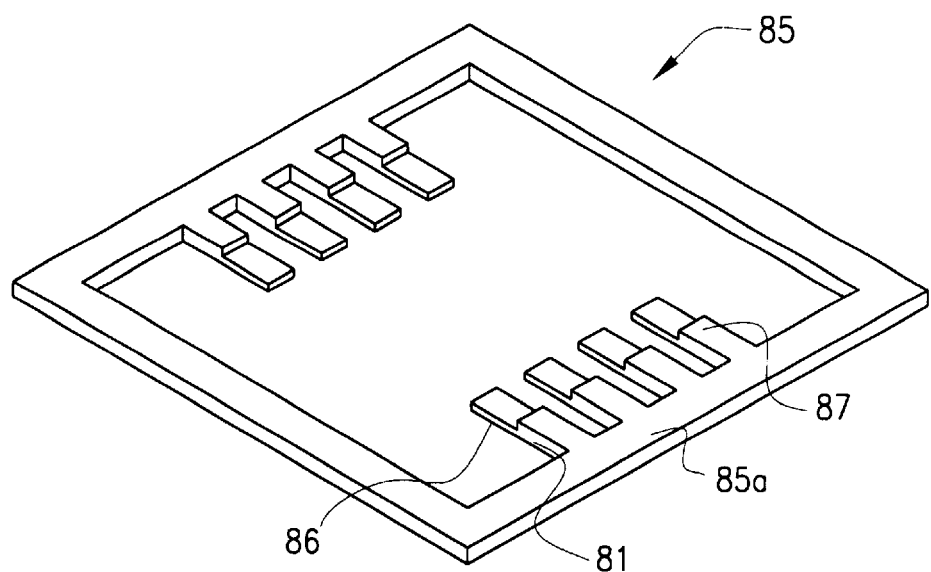
FIG. 6 is a perspective view of a leadframe of a second embodiment of a semiconductor package constructed in accordance with the principles of the present invention.

Referring to FIG. 6, there is shown a perspective view of leadframe 85 of the second embodiment of a semiconductor package constructed in accordance with the principles of the present invention. Leadframe 85 will now be described in further detail. Leads 81 are connected to each other via a tie bar 85a located on the outer perimeter of leadframe 85. Leadframe 85 and leads 81 are made of an electrically conductive material such as, for example, copper. Leads 81 are placed parallel and apart from each other and on opposite sides of leadframe 85. Each one of leads 81 has an inwardly extending member 86 located generally perpendicularly to an upwardly extending member 87. The inwardly extending member 86 and the upwardly extending member 87 may be formed thorough a half etching process. Inwardly extending member 86 extends towards the middle of semiconductor package 80 to support semiconductor chip 82 (shown in FIG. 5).

Referring back to FIG. 5, additional components of semiconductor package 80 will now be described. Leads 81 are shown after the trimming process. (The trimming process will be described in more detail later below.) Semiconductor chip 82 is attached to leads 81, via an adhesive by using any semiconductor chip attaching processing known in the art of semiconductor packaging. Semiconductor chip 82 can be of different sizes because inwardly extending member 86 of each one of leads 81 has a long upper surface for attaching semiconductor chips of various sizes without having to move the location of leads 81, resulting in a change to the footprint of semiconductor package 80. A plurality of bond pads 88 are located on top of semiconductor chip 82. A plurality of wires 83 electrically connect semiconductor chip 82 (via bond pads 88) to leads 81. The location on leads 81 where wires 83 are bonded to leads 81 may, but does not necessarily have to be, electroplated with gold or silver. Wires 83 are made of an electrically conductive material such as, for example, gold, silver, or aluminum. Sealing material 84 secures leads 81, semiconductor chip 82, and the plurality of wires 83 in a spacial relationship. The bottom and one side of each one of the leads 81 rest flush with the outer surfaces of semiconductor package 80 and are exposed to the outside of semiconductor package 80 for electrical and physical connection to a printed circuit board. The electrical and physical connection may, but do not necessarily have to be, achieved through soldering semiconductor package 80 to the printed circuit board (not shown). The exposed surfaces of leads 81 are electroplated with corrosion-minimizing material such as, for example, tin, gold, tin lead, nickel palladium, tin bismuth, or other similar materials known in the art.

Figure 7:
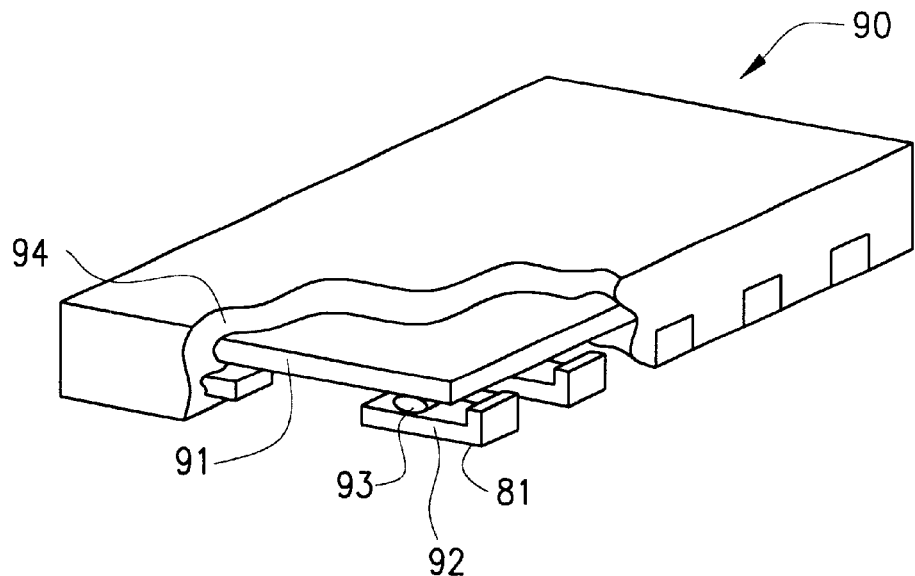
FIG. 7 is a perspective cut-away view of a third embodiment of a semiconductor package constructed in accordance with the principles of the present invention.

Referring now to FIG. 7, there is shown a perspective cut-away view of semiconductor package 90, which is a third embodiment of a semiconductor package constructed in accordance with the principles of the present invention. Semiconductor package 90 is similar in construction (including the construction of the leadframe) to semiconductor package 80. Semiconductor package 90 differs from semiconductor package 80 in that semiconductor chip 91 is flipped upside down and then attached to the plurality of leads 92 via a plurality of solder balls 93. Solder balls 93 are made of an electrically conductive material and allow a direct physical and electrical connection between semiconductor chip 91 and leads 92. Using solder balls 93 to attach semiconductor chip 91 to lead 92 bypasses the use of wires to electrically connect semiconductor chip 91 to leads 92. The advantage of using solder balls 93 instead of wires to connect semiconductor chip 91 to leads 92 is that using solder balls 93 minimizes the chance of wires breaking or becoming disconnected and causing a failure of the entire semiconductor package 90. In addition, using solder balls 83 decreases the overall signal induction, thereby exhancing the electrical performance—i.e., speed—of the package. The semiconductor chip 91 and the plurality of leads 92 are secured in a spacial relationship and are protected from the outside environment by sealing material 94. Sealing material 94 may be thermoplastics or thermoset resins, with theremoset resins including silicones, phenolics, and epoxies. The bottom and one side of each one of the plurality of leads 92 are exposed to the outside of sealing material 94 and rest flush with the bottom and the sides of semiconductor package 90. The exposed bottom and one side of each one of the plurality of leads 92 may be electroplated with corrosion-minimizing material such as, for example, tin, gold, tin lead, nickel palladium, tin bismuth, or other similar materials known in the art.

Figure 8:
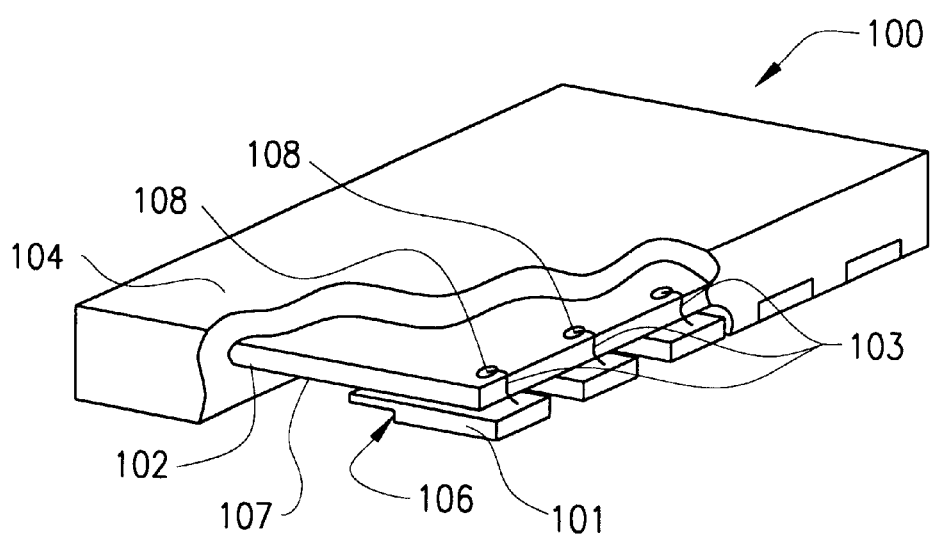
FIG. 8 is a perspective cut-away view of a fourth embodiment of a semiconductor package constructed in accordance with the principles of the present invention.

Referring now to FIG. 8, there is shown a perspective cut-away view of semiconductor package 100, which is a fourth embodiment of a semiconductor package constructed in accordance with the principles of the present invention. Semiconductor package 100 generally has a plurality of leads 101, a semiconductor chip 102, a plurality of wires 103, and sealing material 104. Semiconductor package 100 will be described in more detail below.

Figure 9:
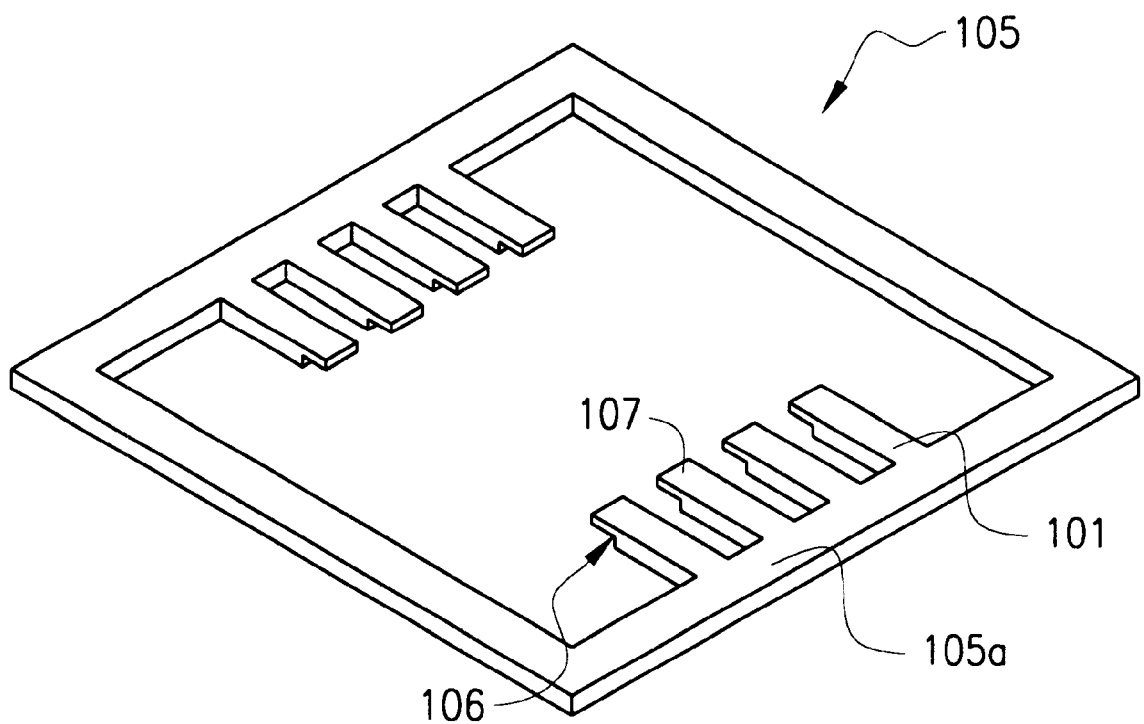
FIG. 9 is a perspective view of a leadframe of a fourth embodiment of a semiconductor package constructed in accordance with the principles of the present invention.

Referring now to FIG. 9, there is shown a perspective view of a leadframe 105 of semiconductor package 100 prior to the packaging process. Leadframe 105 will now be described first in further detail. Leadframe 105 has a plurality of leads 101 placed generally parallel and apart from each other and along the length of semiconductor package 100. Leads 101 are connected to each other via a tie bar 105a located on the outer perimeter of leadframe 105. An equal number of leads 101 may, but does not necessarily have to, rest on each side of semiconductor package 100. Each lead of leads 101 has a notch 106 on the underside of each lead. Notch 106 allows for better locking strength between leads 101 and sealing material 104. Better locking strength minimizes the chance of a lead of leads 101 from becoming detached from semiconductor package 100. Each one of the leads 101 also has an inwardly extending member 107 extending towards the centerline of semiconductor package 100. The top of all leads 101 rest in one horizontal plane so that semiconductor chip 102 of various sizes can be supported by leads 101.

Referring back to FIG. 8, there is shown a perspective cut-away view of semiconductor package 100, after the packaging process has been completed, with the plurality of leads 101 trimmed to their desired lengths. Additional components of semiconductor package 100 will now be described below. The bottom of semiconductor chip 102 is attached to leads 101 through an adhesive using any method known in the art of semiconductor chip attachment. Semiconductor chip 102 can be of any size because the top of leads 101, which provide the supporting surface for semiconductor chip 102, rest in one horizontal plane. A plurality of bond pads 108 are located on top of semiconductor chip 102. A plurality of wires 103 electrically connect semiconductor chip 102, through bond pads 108, to leads 101. The location on leads 101 where wires 103 attach to leads 101 may, but do not necessarily have to be, electroplated with gold or silver. Semiconductor chip 102, leadframe 105, and wires 103 are secured in a spacial relationship using sealing material 104. Sealing material 104 can be thermoplastics or theremoset resin, with thermoset resin including silicones, phenolics, and epoxies. Sealing material 104 also protects semiconductor chip 102 from damage. The bottom and one side of each one of the plurality of leads 101 rest flush with and are exposed to the bottom and side surfaces of semiconductor package 100 without being encased in sealing material 104. The bottom and one side of each one of the plurality of leads 101 may be protected from corrosion by being electroplated with a corrosion-minimizing material such as, for example, tin, gold, tin lead, nickel palladium, tin bismuth, or any other similar material known in the art.

The following applications are all being filed on the same date as the present application and all are incorporated by reference as if wholly rewritten entirely herein, including any additional matter incorporated by reference therein:

| Application Number | Title of Application | First Named Inventor |
|---|---|---|
| 09/687,485 | Semiconductor Package Having Increased Solder Joint Strength | Kil Chin Lee |
| 09/687,487 | Clamp and Heat Block Assembly for Wire Bonding a Semiconductor Package Assembly | Young Suk Chung |
| 09/687,495 | Semiconductor Package | Sean Timothy Crowley |
| 09/687,531 | Stackable Semiconductor Package and Method for Manufacturing Same | Sean Timothy Crowley |
| 09/687,530 | Stackable Semiconductor Package and Method for Manufacturing Same | Jun Young Yang |
| 09/687,126 | Method of and Apparatus for Manufacturing Semiconductor Packages | Hyung Ju Lee |
| 09/687,493 | Semiconductor Package Having Improved Adhesiveness and Ground Bonding | Sung Sik Jang |
| O9/687,541 | Semiconductor Package Leadframe Assembly and Method of Manufacture | Young Suk Chung |

Although a preferred embodiment of the method and apparatus of the present invention has been illustrated in the accompanying drawings and described in the foregoing detailed description, it will be understood that the invention is not limited to the embodiment disclosed, but is capable of numerous rearrangements, modifications, and substitutions without departing from the spirit of the invention as set forth and defined by the following claims.

What is claimed is:

1. A semiconductor package, comprising:

a leadframe comprising:

a die paddle defining opposed, generally planar top and bottom sides; and a plurality of leads extending at least partially about the die paddle in spaced relation thereto, each of the leads defining a generally planar top side which extends in generally co-planar relation to the top side of the die paddle and an opposed, generally planar bottom side;

a semiconductor chip partially overlapping and being attached to the top side of the die paddle and the top side of at least one of the leads, the semiconductor chip being electrically connected to at least one of the leads; and a sealing material at least partially encapsulating the leadframe and the semiconductor chip such that the bottom side of each of the leads is exposed within the sealing material.

2. The semiconductor package of claim 1 wherein:

the die paddle has a generally square configuration defining four peripheral edge segments; and the leads are segregated into two sets which extend along respective ones of an opposed pair of the peripheral edge segments defined by the die paddle.

3. The semiconductor package of claim 1 wherein the semiconductor chip is electrically connected to the top side of at least one of the leads via a conductive wire which is covered by the sealing material.

4. The semiconductor package of claim 1 wherein:

each of the leads further defines an inner end which is disposed adjacent to the die paddle and a notched surface which is disposed in opposed relation to the top side and extends to the inner end; and each of the leads has a first thickness between the top and bottom sides which exceeds a second thickness between the top side and the notched surface.

5. The semiconductor package of claim 1 wherein:

each of the leads further defines an outer end; and the sealing material encapsulates the leadframe such that the outer end of each of the leads is exposed within the sealing material.

6. The semiconductor package of claim 1 wherein the semiconductor chip is electrically connected to the top side of at least one of the leads via a solder ball.

7. The semiconductor package of claim 1 wherein the bottom sides of the leads extend in generally co-planar relation to each other.

* * * * *